United States Patent
Hashimoto et al.

(10) Patent No.: US 6,327,087 B1
(45) Date of Patent: Dec. 4, 2001

(54) OPTICAL-THIN-FILM MATERIAL, PROCESS FOR ITS PRODUCTION, AND OPTICAL DEVICE MAKING USE OF THE OPTICAL-THIN-FILM MATERIAL

(75) Inventors: Tokiko Hashimoto, Moriya-machi; Takahiro Kato, Toride, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/456,949

(22) Filed: Dec. 7, 1999

(30) Foreign Application Priority Data

Dec. 9, 1998 (JP) .................................................. 10-368498
Dec. 17, 1998 (JP) .................................................. 10-375729

(51) Int. Cl.$^7$ .............................. G02B 1/10; G02B 5/08; B05D 5/06; B32B 15/04
(52) U.S. Cl. .......................... 359/586; 359/584; 359/580; 359/350; 359/359; 428/471; 427/162; 427/166
(58) Field of Search ..................................... 359/580, 586, 359/588, 359, 350, 584, 585; 428/697, 471; 427/162, 166

(56) References Cited

U.S. PATENT DOCUMENTS

| 3,934,961 | 1/1976 | Itoh et al. ............................. 350/164 |
| 4,173,778 | 11/1979 | Snavely et al. . |
| 4,927,239 | 5/1990 | Melzig et al. . |
| 5,340,607 | 8/1994 | Friz et al. ............................. 427/162 |
| 5,415,946 | 5/1995 | Friz ....................................... 428/697 |
| 5,850,309 | * 12/1998 | Shirai et al. ........................ 359/584 |
| 5,989,626 | 11/1999 | Coombs et al. . |

FOREIGN PATENT DOCUMENTS

| 6-184730 | 7/1994 | (JP) . |
| 6-235803 | 8/1994 | (JP) . |

* cited by examiner

*Primary Examiner*—Audrey Chang
(74) *Attorney, Agent, or Firm*—Fitzpatrick, Cella, Harper & Scinto

(57) ABSTRACT

An optical-thin-film material comprising a metal oxide containing samarium and titanium, or having a compound represented by the following chemical formula:

$$Sm_{1-x}Al_{1+x}O_3$$

wherein $-1<x<1$ is disclosed. An optical device having an optical thin film formed of such a material is also disclosed. This optical-thin-film material does not cause any compositional deviation to enable continuous deposition when used as a vacuum deposition material, and does not cause any deterioration due to ultraviolet-light irradiation.

12 Claims, 4 Drawing Sheets

OPTICAL-THIN-FILM MATERIAL, PROCESS FOR ITS PRODUCTION, AND OPTICAL DEVICE MAKING USE OF THE OPTICAL-THIN-FILM MATERIAL

BACKGROUND OF THE INVENTION

1. Field of the Invention

This invention relates to an optical-thin-film material used to coat lenses, mirrors and prisms used in optical instruments such as cameras and video cameras or to coat optical devices such as optical disks. It also relates to an optical device provided with an optical thin film formed by coating such a material.

2. Related Background Art

In cameras, video cameras and other optical instruments, metal oxide thin-film coating is utilized in their anti-reflection films, filters, mirrors and so forth in order to enhance or reduce the reflection of light or in order to absorb or transmit specific wavelength light.

Of these metal oxide optical thin films, in particular, multi-layer thin films alternately superposingly formed of thin films having a high refractive index and thin films having a low refractive index can selectively transmit or reflect specific wavelength light. Hence, they are used as a coating material for optical filters or prisms in a large number in optical instruments as typified by projectors. Such multi-layer thin films are produced by physical vapor deposition (PVD) as typified by vacuum deposition (or evaporation) and sputtering. These multilayer thin films, however, have so large a total number of films that it often takes a long time for film formation, leading to a problem of a low productivity. As a countermeasure therefor, the designing of multi-layer thin films is elaborated to lessen the total number of films. As other measures, in vacuum deposition, films are formed at a high rate or materials are used which can enjoy a short premelt time for stabilizing evaporation sources. In sputtering, magnetron sputtering is employed, which is used to form films at a higher rate. Also, in order to improve productivity, film-forming systems are being shifted from batch-type systems to continuous-type systems.

In the case of the continuous-type systems in vacuum deposition, films are formed while supplying substrates and replenishing evaporation source targets. Hence, the evaporation source targets must be those having shapes suited for individual systems and also can attain stable characteristics during continuous use. In general, when the multi-layer thin films alternately superposingly formed of high-refractive-index films and low-refractive-index thin films are formed, materials that may cause variations in refractive index because of compositional variations or materials that have much non-homogeniety are not preferable as evaporation substances when the multi-layer thin films are formed by the continuous-type systems.

When these filters and prisms coated with the coating material are used as beam splitters in optical instruments, optical multi-layer thin films are often face to face bonded with adhesives when used. As the adhesives, ultraviolet-curable resins are used in view of an advantage that they can cure in a short time and a solvent need not be used. Widely used is a method in which the ultraviolet-curable resins are irradiated by ultraviolet light to cure and join the thin films. However, such ultraviolet-light irradiation causes the metal oxide optical thin films to undergo deoxydation reaction due to photochemical reaction, brining about a problem of a deterioration of optical thin films, e.g., a decrease in light transmission.

As a material that may not cause any compositional variations or have any non-homogeniety and has a high refractive index, a compound represented by the formula: $La_2Ti_2O_{7-x}$ (wherein x is 0.3 to 0.7) is known in the art as disclosed in Japanese Patent Application Laid-Open No. 6-235803.

However, in deposition materials conventionally used for optical thin films having a high refractive index as stated above, the materials may so greatly scatter that it takes a long premelt time for stabilizing evaporation sources, or their continuous use may cause compositional changes, resulting in a change in refractive index. Also, because of a certain non-homogeniety, the multi-layer formation of films may result in a difference of values from designed values. Also, the irradiation of deposited thin films with ultraviolet light may cause an increase in absorptivity, which inhibits the bonding of the thin films using ultraviolet-curable resins. There are other various problems.

In the compound represented by the formula $La_2Ti_2O_{7-x}$ (x=0.3 to 0.7), too, although it is a material that may not cause any compositional variations or have any non-homogeniety and has a high refractive index, this material may so greatly scatter at the time of premelting that it must be premelted for a long time every time materials are added. Moreover, it may cause a deterioration due to irradiation with ultraviolet light. Thus, this material is not a preferred material.

As materials for optical thin films, substances or compounds are required which have a refractive index intermediate between that of aluminum oxide ($Al_2O_3$), having a refractive index of about 1.65, and that of zirconium oxide ($ZrO_2$), having a refractive index of about 2.0. Such substances or compounds include silicon monoxide (SiO), magnesium oxide (MgO), lead fluoride ($PbF_2$), a mixture of aluminum oxide ($Al_2O_3$) and zirconium oxide ($ZrO_2$), disclosed in U.S. Pat. No. 3,934,961, and a mixture of lanthanum oxide ($La_2O_3$) and aluminum oxide ($Al_2O_3$), disclosed in Japanese Patent Application Laid-Open No. 6-184730, which have been put into use.

However, when used as optical thin films, the above substances or compounds put into use as being achievable of the intermediate refractive index (about 1.6 to 1.9) have problems respectively as stated below. Thus, any substances or compounds suited as optical thin films having an intermediate refractive index are substantially almost unavailable.

That is, the silicon monoxide (SiO) has a problem that thin films cause an absorption to result in a decrease of transmittance. The magnesium oxide (MgO) has a problem that it reacts with water or carbon dioxide in the air to change into magnesium hydroxide or magnesium carbonate to cause clouding. The lead fluoride ($PbF_2$) has a problem of environmental pollution due to lead.

The mixture of aluminum oxide ($Al_2O_3$) and zirconium oxide ($ZrO_2$), though having a good reproducibility of refractive index, has a problem that it may cause a compositional deviation in materials because of a difference in vapor pressure to make it unable to carry out cost-advantageous continuous deposition while replenishing materials. The mixture of lanthanum oxide ($La_2O_3$) and aluminum oxide ($Al_2O_3$) has a problem that the lanthanum oxide in the mixture reacts with water in the air to change into lanthanum hydroxide to cause expansion, making sintered evaporation source materials and formed films break down. Their breaking down into powder causes fine particulate matters because of chemicals which may scatter when dissolved, to further cause a problem of compositional deviation in film materials during the deposition.

As stated above, although various deposition materials are conventionally used as substances or mixtures achievable of the refractive index intermediate between alumina (about 1.65) and zirconia (about 2.0), they have properties undesirable as deposition materials, causative of compositional deviation or occurrence of absorption during the deposition.

SUMMARY OF THE INVENTION

A first object of the present invention is to solve the above problems the prior art has had, and provide a material for optical thin films which has a relatively high refractive index and does not cause any compositional deviation to enable continuous deposition when used as a vacuum deposition material, and does not cause any deterioration due to ultraviolet-light irradiation. Accordingly, there may be provided an optical device having superior optical characteristics, comprising an optical thin film formed by coating such a material.

A second object of the present invention is to provide a material for optical thin films which has a refractive index of about 1.65 to 1.9, does not cause any compositional deviation to enable continuous deposition when used as a vacuum deposition material, and has good quality. Accordingly, there may be provided an optical device having superior optical characteristics, comprising an optical thin film formed by coating such a material.

To achieve the above objects, the present invention provides an optical-thin-film material comprising a metal oxide containing samarium and titanium.

The present invention also provides an optical device comprising:
 a substrate; and
 an optical thin film comprising the above optical-thin-film material, formed on the substrate.

The present invention also provides an optical device comprising:
 a substrate;
 a plurality of first optical thin films comprising the above optical-thin-film material, formed on the substrate; and
 a plurality of second optical thin films each having a lower refractive index than the first optical thin films and superposed on the substrate alternately with the first optical thin films.

As another embodiment of the optical-thin-film material, the present invention provides an optical-thin-film material comprising a compound represented by the following chemical formula:

$Sm_{1-x}Al_{1+x}O_3$ wherein $-1<x<1$; and
 also provides an optical device comprising such an optical-thin-film material and corresponding to the above two types of optical devices.

The present invention still also provides a process for producing the above optical-thin-film materials, the process comprising the steps of:
 mixing samarium oxide and aluminum oxide; and
 sintering, melting and solidifing the resultant mixture in vacuum or in the atmosphere.

BRIEF DESCRIPTION OF THE DRAWINGS

FIG. 4 is a graph showing wavelength dispersion of absorptivity in a film formed by depositing the optical-thin-fil material of the present invention in which samarium and aluminum are in a molar ratio of 0.5.

DESCRIPTION OF THE PREFERRED EMBODIMENTS

An optical-thin-film material having a relatively high refractive index will be described first, which is a first embodiment of the present invention. This optical-thin-film material comprises a metal oxide containing samarium (Sm) and titanium (Ti) as metallic elements, and preferably a sintered product or fused product composed chiefly of from 10 to 80% by weight of samarium oxide ($Sm_2O_3$) and the balance of titanium oxide ($TiO_2$).

This sintered product is obtained by a production process comprising mixing a powder of samarium oxide and a powder of titanium oxide in a desired compositional proportion as described above, and pressure-molding the resultant mixture into granules or a platelike target, followed by sintering in vacuum or in the atmosphere at a temperature of 1,400° C. or above. The pressure-molded product before sintering may be melted at a higher temperature and then solidified to form a fused product.

Such a sintered product or fused product is melted and evaporated chiefly by means of an electron gun and is formed by deposition as an optical thin film on any intended substrate. The sintered product or fused product is melted chiefly by means of an electron gun, but resistance heating, high-frequency heating, or sputtering may also be used.

In the optical-thin-film material comprising from 10 to 80% by weight of samarium oxide and the balance of titanium oxide, the compositional proportion of a mixture of both may be changed to set its refractive index selectively to any desired value within the range of from 1.9 to 2.4. Also, the optical-thin-film material does not scatter during the melting with an electron gun and also does not cause any compositional variations, and hence continuous film formation can be made.

Needless to say, the optical thin film having a high refractive index, formed using the material according to the first embodiment of the present invention, may superposingly be formed in combination with other optical thin films having various refractive indexes to make up optical multi-layer thin films to obtain various multi-layer thin films having good optical characteristics.

In the present invention, the substrate on which the optical thin film is formed may include, but is not particularly limited to, optical glass such as prisms, filters and so forth, as well as display screens of cathode ray tubes, and lenses of eye-glasses and cameras.

The optical thin film having a high refractive index, formed using the material according to the first embodiment of the present invention, does not cause any increase in absorptivity even upon irradiation by ultraviolet light, and does not cause any problem even when bonded with an ultraviolet-curable resin.

Figure 1:
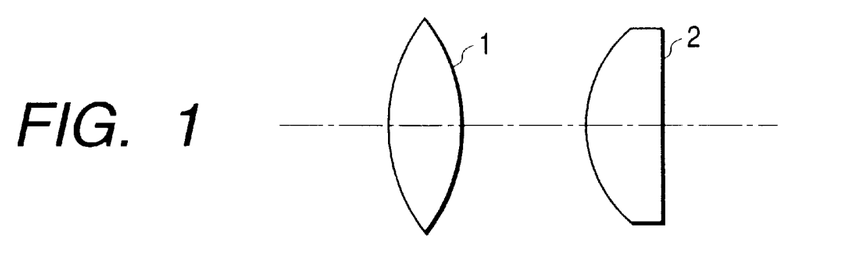
FIG. 1 is a schematic illustration of an optical system employing anti-reflection films formed of the optical-thin-film material of the present invention.

FIG. 1 schematically illustrates an optical system employing as an anti-reflection film a film formed of the optical-thin-film material of the present invention. In FIG. 1, reference numerals 1 and 2 each denote a lens. Anti-reflection films are formed on light incident and emergent surfaces of these lenses 1 and 2.

Figure 2:
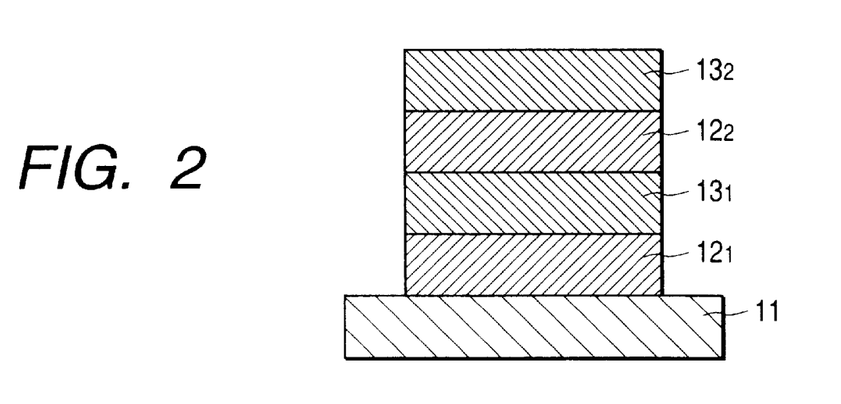
FIG. 2 is a schematic cross-sectional illustration of an example of layer configuration of an anti-reflection film formed on a lens of the optical system shown in FIG. 1.

FIG. 2 schematically cross-sectionally illustrates an example of layer configuration of an anti-reflection film formed on any of the lenses 1 and 2 of the optical system shown in FIG. 1. In FIG. 2, reference numeral 11 denotes a substrate constituting the lens. On the substrate 11, high-refractive-index layers $12_1$ and $12_2$ and low-refractive-index layers $13_1$ and $13_2$ are alternately superposed. As materials for the high-refractive-index layers $12_1$ and $12_2$, the metal oxide containing samarium and titanium, which is the first embodiment of the present invention, is used. As materials for the low-refractive-index layers $13_1$ and $13_2$, $SiO_2$ is used. Also, the high-refractive-index layers $12_1$ and $12_2$ each have a refractive index of 2.17 to near ultraviolet light of 365 nm in wavelength, and the low-refractive-index layers $13_1$ and $13_2$, a refractive index of 1.45.

The optical-thin-film material according to the first embodiment of the present invention will be described below in greater detail by giving Examples for deposition materials. The present invention is by no means limited to these Examples.

EXAMPLE 1

Powder of samarium oxide ($Sm_2O_3$) and powder of titanium oxide ($TiO_2$) were mixed in a weight ratio of 69:31 (molar ratio 1:2), and the mixture obtained was pressure-molded into granules, followed by sintering at 1,580° C. for 4 hours in the atmosphere to produce a granular deposition material.

This granular deposition material was set in a depositing hearth of an electron gun (JEBG102, manufactured by Nippon Denshi K. K.) disposed in a vacuum deposition coater (BMC850, manufactured by Shincron CO., LTD.). The inside of the system was evacuated up to $1 \times 10^{-5}$ Torr. Thereafter, electron beams were applied under pressure condition of $1 \times 10^{-4}$ Torr as oxygen partial pressure to cause the deposition material to melt and evaporate and to deposit in an optical film thickness of nd =125 nm on a synthetic quartz flat plate having been set in the vacuum vessel and heated to a temperature of about 300° C. During this deposition, the deposition material was seen not to scatter. After the deposition was completed, the synthetic quartz flat plate was taken out. On the thin film formed thereon, its absorption (A) and refractive index (n) were calculated from its transmittance (T) and reflectance (R) determined with a spectrophotometer (Model U-3410, manufactured by Hitachi Ltd.) to make evaluation of the thin film. The absorption (A) was calculated according to the following expression (1), and the refractive index (n) according to the following expression (2).

$$A=100-(T+R) \qquad (1)$$

$$n=\{n_s \times (1+R^{1/2})/(1-R^{1/2})\}^{1/2} \qquad (2)$$

Where ns is the index substrate.

As a result of this evaluation, the optical thin film according to the present Example had a refractive index (n) of 2.18 at wavelength 487 nm as shown in Table 1, and showed no absorption in the visible region and up to wavelength of 370 nm.

The synthetic quartz flat plate provided with the optical thin film of the present Example was also irradiated by ultraviolet rays of 360 nm in wavelength and 200 mW/cm² in intensity for 5 seconds by means of an ultraviolet ray irradiator (SUNCURE202-PS, manufactured by AGC), and its absorptivity was measured immediately thereafter to find that the absorptivity was 0.2% or less in the visible region and there was seen no increase.

EXAMPLE 2

A granular deposition material was produced in the same manner as in Example 1 except that the powder of samarium oxide ($Sm_2O_3$) and powder of titanium oxide ($TiO_2$) were mixed in a weight ratio of 54:46 (molar ratio 1:4). The subsequent procedure of Example 1 was repeated to deposit an optical thin film on a synthetic quartz flat plate. Thereafter, the optical thin film was tested similarly to find that the optical thin film had a refractive index (n) of 2.37 as shown in Table 1 and showed no absorption in the visible region and up to wavelength of 370 nm.

The synthetic quartz flat plate provided with the optical thin film of the present Example was also irradiated by ultraviolet rays in the same manner as in Example 1, and its absorptivity was measured to find that there was seen no increase in absorptivity.

EXAMPLE 3

A granular deposition material was produced in the same manner as in Example 1 except that the powder of samarium oxide ($Sm_2O_3$) and powder of titanium oxide ($TiO_2$) were mixed in a weight ratio of 81:19 (molar ratio 1:1). The subsequent procedure of Example 1 was repeated to deposit an optical thin film on a synthetic quartz flat plate. Thereafter, the optical thin film was tested similarly to find that the optical thin film had a refractive index (n) of 2.03 as shown in Table 1 and showed no absorption in the visible region and up to wavelength of 370 nm.

The synthetic quartz flat plate provided with the optical thin film of the present Example was also irradiated by ultraviolet rays in the same manner as in Example 1, and its absorptivity was measured to find that there was seen no increase in absorptivity.

EXAMPLE 4

The procedure of Example 1 was repeated except that thin films of 125 nm in optical film thickness were continuously deposited ten times without replenishing the granular deposition material. The films formed were compositionally analyzed with a fluorescent X-ray analyzer (RIX-3000, manufactured by Rigaku Denki K. K.), and there was seen no compositional change. Their refractive index (n) was also measured, and similarly there was seen no change.

Comparative Example 1

Powder of lanthanum oxide ($La_2O_3$) and powder of titanium oxide ($TiO_2$) were mixed in a weight ratio of 67:33 (molar ratio 1:2), and the mixture obtained was molded into granules, followed by sintering at 1,590° C. for 8 hours in vacuum to produce a granular deposition material (the compound represented by the formula $La_2Ti_2O_{7-x}$; =0.3 to 0.7). This granular deposition material was deposited on a synthetic quartz flat plate in the same manner as in Example 1, which was then irradiated by ultraviolet rays, and its absorptivity was measured immediately thereafter to find that, as shown in Table 1, the absorptivity was seen to increase by 2.4% or more.

Comparative Example 2

The granular deposition material (Sm2Ti2O7) produced by mixing powder of samarium oxide ($Sm_2O_3$) and powder of titanium oxide ($TiO_2$) in a weight ratio of 69:31 (molar ratio 1:2), followed by molding and sintering, and the granular deposition material ($La_2Ti_2O_{7-x}$; x=0.3 to 0.7) produced by mixing powder of lanthanum oxide ($La_2O_3$) and powder of titanium oxide ($TiO_2$) in a weight ratio of 67:33 (molar ratio 1:2) were each weighed out in equal weights (4 g, 5 g and 7 g). These were each melted and evaporated by means of an electron gun, and the time (premelt time) taken until the scattering of the material went down under equal conditions was measured. As a result, the deposition material comprising samarium oxide and titanium oxide according to the present invention caused no scattering of material and also, as shown in Table 2, showed a short melting time. Thus, this is a material preferable as a material for continuous deposition. On the other hand, the deposition material comprising lanthanum oxide and titanium oxide greatly scatterred and took a longer time to melt.

TABLE 1

| Deposition material | Refractive index | Absorptivity* |
|---|---|---|
| Samarium oxide:titanium oxide = 69:31 (weight ratio) | 2.18 | 0.2 |
| Samarium oxide:titanium oxide = 54:46 (weight ratio) | 2.37 | 0.3 |
| Samarium oxide:titanium oxide = 81:19 (weight ratio) | 2.03 | 0.2 |
| $La_2Ti_2O_{7-x}$ (x = 0.3 to 0.7) | — | 2.4 |

*after ultraviolet-light irradiation

TABLE 2

| Deposition material | Melting time | | |
|---|---|---|---|
| | 4 g | 5 g | 7 g |
| Samarium oxide:titanium oxide = 69:31 (weight ratio) | 0'38" | 0'52" | 1'07" |
| $La_2Ti_2O_{7-x}$ (x = 0.3 to 0.7) | 3'39" | 5'49" | 9'22" |

An optical-thin-film material having an intermediate refractive index of from 1.65 to 1.9 will be described below, which is a second embodiment of the present invention. This optical-thin-film material comprises a metal oxide containing samarium (Sm) and aluminum (Al) as metallic elements. It is produced by mixing samarium oxide ($Sm_2O_3$) and aluminum oxide ($Al_2O_3$) in a desired compositional proportion and, in a sense that the film composition is stable, preferably in such a proportion that the samarium oxide is 0.3 or more in molar ratio to the aluminum oxide, followed by sintering, or melting and solidification. This material is compositionally represented by the chemical formula: $Sm_{1-x}Al_{1+x}O_3$ (wherein $-1<x<1$).

A sintered product of this material is obtained by mixing powder of samarium oxide and powder of aluminum oxide in a desired compositional proportion as described above, and press-molding the resultant mixture, followed by sintering in vacuum or in the atmosphere at a temperature of about 1,500° C. After sintering, the sintered product obtained is pulverized to produce a granular deposition material of 1 to 3 mm in diameter.

The sintered product or the like of the deposition material is melted and evaporated chiefly by means of an electron gun and is formed by deposition as an optical thin film on any intended substrate. The sintered product, however, may also be melted by means of resistance heating or high-frequency heating.

In the optical-thin-film material according to the second embodiment of the present invention, the compositional proportion of the samarium oxide and aluminum oxide may be changed to set its refractive index to any desired value, which can selectively be set within the range of from 1.65 to 1.9. Also, the compositional proportion in the optical thin film can be stable, and continuous deposition can be carried out while replenishing materials. Also, no remarkable absorption or clouding is seen, and optical thin films free of fine particulate matters which may be caused by scattering of chemicals can be obtained, also making it easy to work and use the products.

In the second embodiment of the present invention, too, the substrate on which the optical thin film is formed may include, but is not particularly limited to, optical glass serving as substrates of prisms, filters and so forth, as well as display screens of cathode ray tubes, and lenses of eye-glasses and cameras.

Needless to say, the optical thin film having an intermediate refractive index, formed using the material according to the second embodiment of the present invention, may superposingly be formed in combination with other optical thin films having various refractive indexes to make up optical multi-layer thin films to obtain various multi-layer thin films having good optical characteristics.

Figure 3:
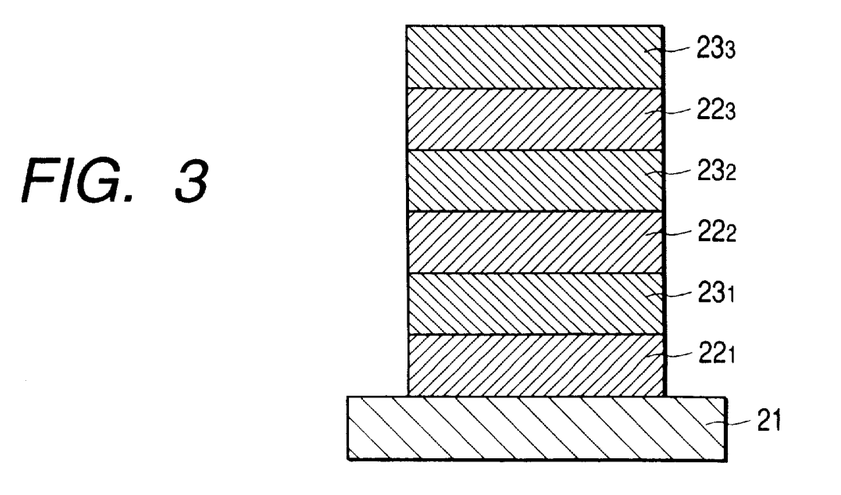
FIG. 3 is a schematic cross-sectional illustration of another example of layer configuration of an anti-reflection film formed on a lens of the optical system shown in FIG. 2.

FIG. 3 schematically illustrates an example in which the optical-thin-film material according to the second embodiment of the present invention is used in the anti-reflection films formed on the lenses 1 and 2 of the optical system shown in FIG. 1. In FIG. 3, reference numeral 21 denotes a substrate constituting the lens. On the substrate 21, high-refractive-index layers $22_1$, $22_2$ and $22_3$ and low-refractive-index layers $23_1$, $23_2$, and $23_3$ are alternately superposed. As materials for the high-refractive-index layers $22_1$, $22_2$ and $22_3$, $Sm_{1-x}Al_{1+x}O_3$ (wherein $-1<x<1$) is used. As materials for the low-refractive-index layers $23_1$, $23_2$ and $23_3$, $SiO_2$ is used. Also, the high-refractive-index layers $22_1$, $22_2$ and $22_3$ each have a refractive index of 1.73 to light of 248 nm in wavelength, and the low-refractive-index layers $23_1$, $23_2$ and $23_3$, a refractive index of 1.51.

The optical-thin-film material according to the second embodiment of the present invention will be described below in greater detail by giving Examples. The present invention is by no means limited to these Examples.

EXAMPLE 5

Powder of samarium oxide ($Sm_2O_3$) and powder of aluminum oxide ($Al_2O_3$) were so mixed that the molar ratio of Sm and Al (Sm/Al) was 1, and the mixture obtained was pressure-molded. Thereafter, the molded product obtained was sintered at 1,500° C. for about 4 hours in a vacuum of $1\times10^{-4}$ Torr or below, followed by pulverization to produce a granular deposition material of 1 to 3 mm in diameter.

Next, this granular deposition material was loaded in a depositing hearth of an electron gun disposed in a vacuum deposition coater (BMC850, manufactured by Shincron CO., LTD.). The inside of the reactor was evacuated up to a pressure of $1\times10^{-5}$ Torr. Thereafter, oxygen gas was fed into the reactor at $1\times10^{-4}$ Torr and electron beams with an accelerating voltage of 8 kV and an emission current of 400 mA were applied to heat and melt the deposition material. Thereafter, on a depositing substrate made of glass, having been set in the reactor and heated to a temperature of about 300° C., an optical-thin film with an optical film thickness of $\lambda/4$ ($\lambda$=480 nm) was deposited at a deposition rate of about 10 Å/second. This deposition was continuously carried out ten times on different substrates.

Figure 4:
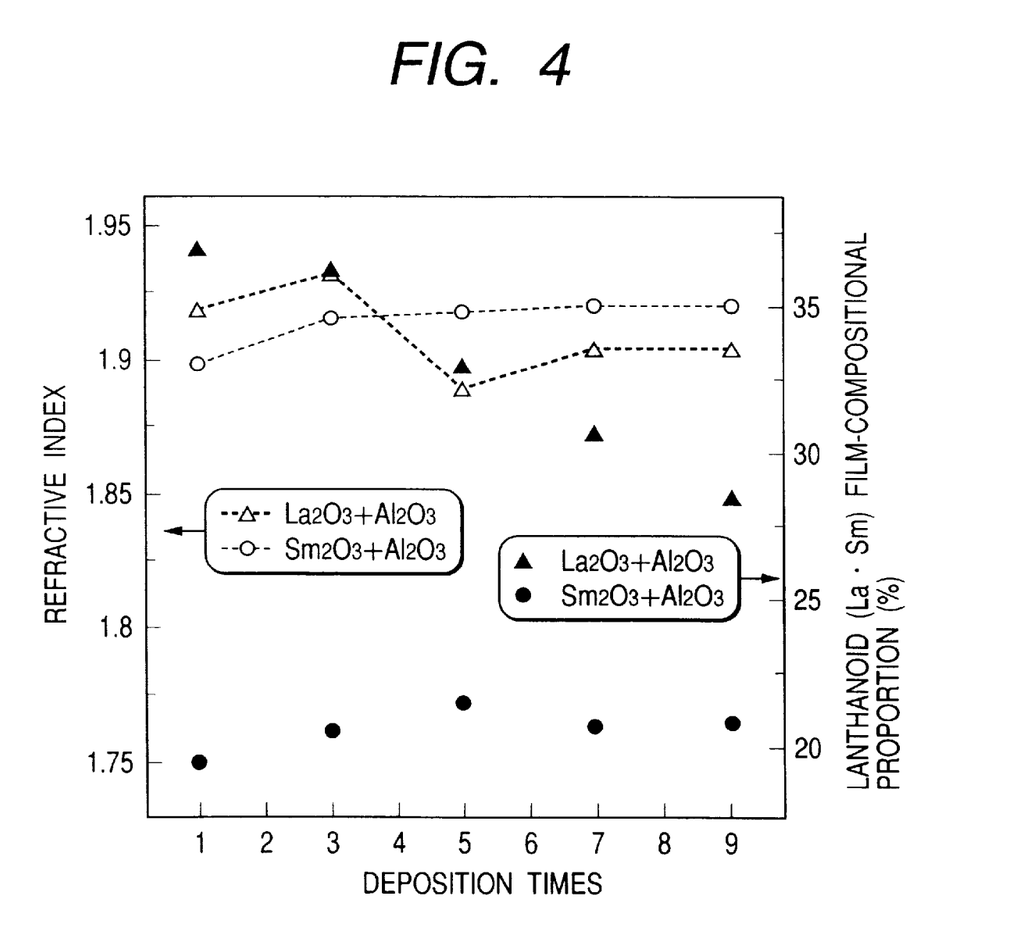
FIG. 4 is a graph showing changes in refractive index and film-compositional proportion in instances where optical-thin-film materials of an Example of the present invention and a Comparative Example were deposited continuously.
Figure 5A:
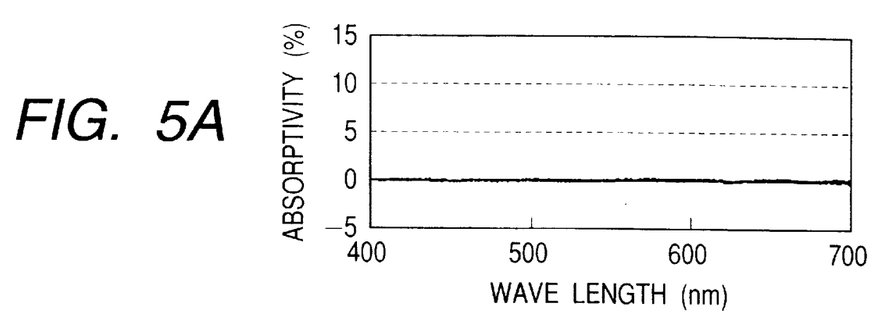
FIG. 5A and FIG. 5B are each a graph showing wavelengt dispersion of absorptivity in a film deposited on the first time and a film deposited on the 10 th time.
Figure 5B:
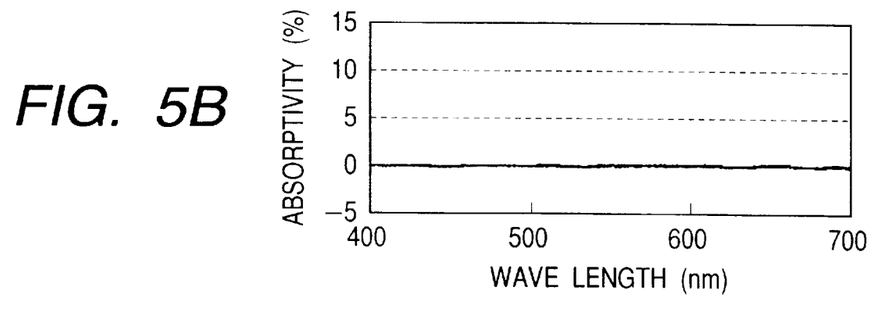

On each optical thin film thus formed, the refractive index was calculated from peak values of its spectral characteristics and the samarium concentration (in terms of oxide; % by weight) in the film was measured by fluorescent X-ray analysis to obtain the results shown in FIG. 4. With regard to wavelength dispersion of absorptivity in the film deposited on the first time and the film deposited on the 10 th time, results are shown in FIGS. 5A and 5B. Also, the optical thin films formed were put to a weathering test in a thermo-hygrostat (60° C., 95% RH, 100 hours), and whether or not any clouding or yellowing occurred was visually examined.

As a result, the refractive index and the samarium concentration in each film were kept stable as shown in FIG. 4 (by dotted lines with white circles and black circles, respectively). Also, no absorption was seen as shown in FIGS. 5A and 5B. Still also, neither absorption nor clouding was seen after the weathering test.

EXAMPLE 6

Powder of samarium oxide ($Sm_2O_3$) and powder of aluminum oxide ($Al_2O_3$) were so mixed that the molar ratio of Sm and Al (Sm/Al) was 0.5, and the mixture obtained was pressure-molded. Thereafter, the molded product obtained was sintered at 1,500° C. for about 4 hours in a vacuum of $1\times10^{-4}$ Torr or below, followed by pulverization to produce a granular deposition material of 1 to 3 mm in diameter.

Figure 6:
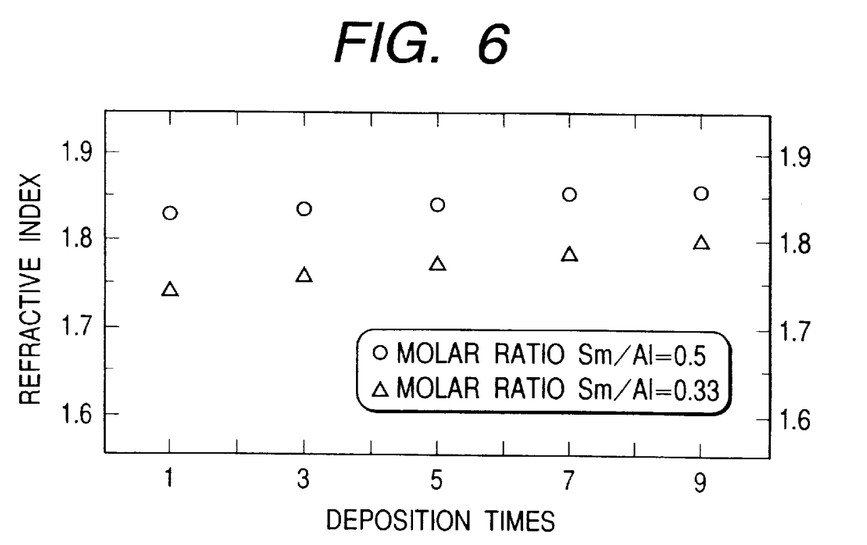
FIG. 6 is a graph showing changes in refractive index in instances where optical-thin-film materials of two Examples of the present invention have different molar ratios of samarium and aluminum.
Figure 7:
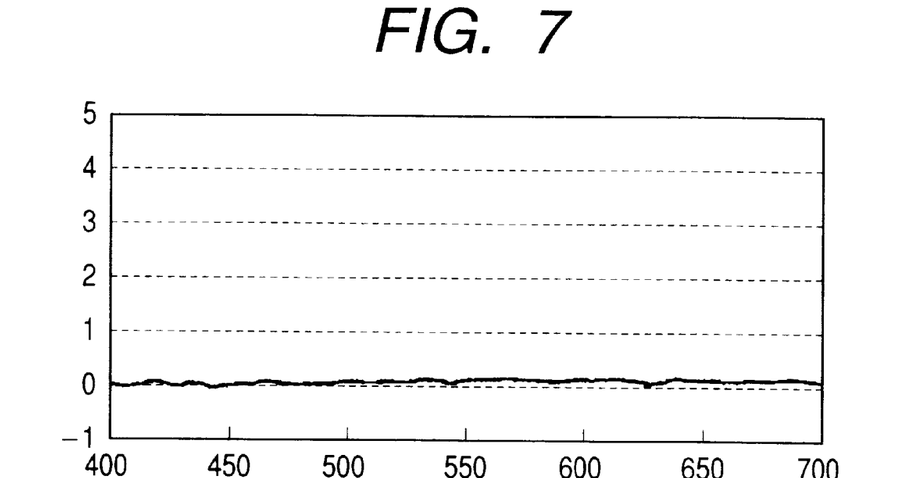

Next, using this deposition material, optical thin films were continuously deposited ten times on different substrates in the same manner as in Example 5. On each optical thin film thus formed, the refractive index was calculated from peak values of its spectral characteristics, and the wavelength dispersion of absorptivity was measured in the same way. Results obtained are shown in FIGS. 6 and 7. Also, the optical thin films formed were put to a weathering test in a thermo-hygrostate (60° C., 95% RH, 100 hours), and whether or not any clouding or yellowing occurred was visually examined.

As a result, in the present Example, too, the refractive index was kept stable as shown in FIG. 6, and no absorption was seen as shown in FIG. 7. Also, neither absorption nor clouding was seen after the weathering test.

EXAMPLE 7

Powder of samarium oxide ($Sm_2O_3$) and powder of aluminum oxide ($Al_2O_3$) were so mixed that the molar ratio of Sm and Al (Sm/Al) was 0.33, and the mixture obtained was pressure-molded. Thereafter, the molded product obtained was sintered at 1,500° C. for about 4 hours in a vacuum of $1\times10^{-4}$ Torr or below, followed by pulverization to produce a granular deposition material of 1 to 3 mm in diameter.

Figure 8:
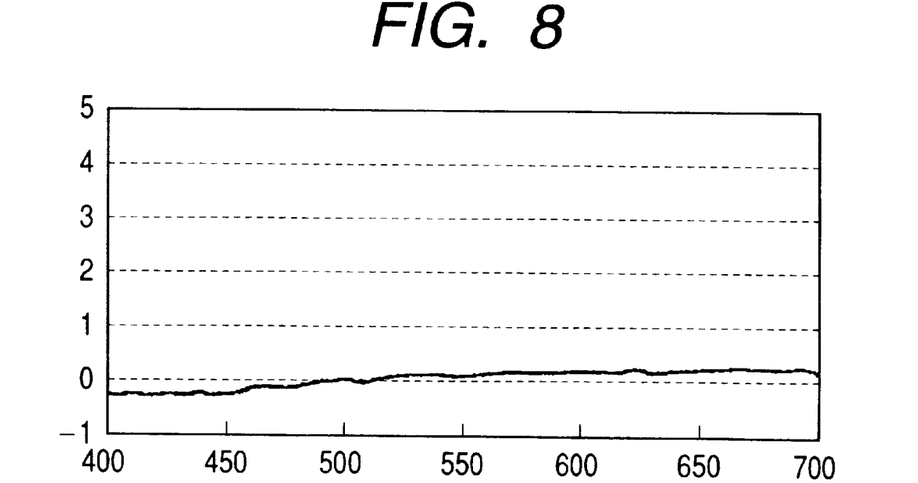
FIG. 8 is a graph showing wavelength dispersion of absorptivity in a film formed by depositing the optical-thin-film matirial of the present invention in which samarium and aluminum are in a molar ratio of 0.33.

Next, using this deposition material, optical thin films were continuously deposited ten times on different substrates in the same manner as in Example 5. On each optical thin film thus formed, the refractive index was calculated from peak values of its spectral characteristics and the wavelength dispersion of absorptivity was measured in the same way. Results obtained are shown in FIGS. 6 and 8. Also, the optical thin films formed were put to a weathering test in a thermo-hygrostate (60° C., 95% RH, 100 hours), and whether or not any clouding or yellowing occurred was visually examined.

As a result, in the present Example, too, the refractive index was kept stable as shown in FIG. 6, and no absorption was seen as shown in FIG. 8. Also, neither absorption nor clouding was seen after the weathering test.

EXAMPLE 8

Powder of samarium oxide ($Sm_2O_3$) and powder of aluminum oxide ($Al_2O_3$) were so mixed that the molar ratio of Sm and Al (Sm/Al) was 1, and the mixture obtained was pressure-molded. Thereafter, the molded product obtained was sintered at 1,500° C. for about 4 hours in a vacuum of $1\times10^{-4}$ Torr or below, followed by pulverization to produce a granular deposition material of 1 to 3 mm in diameter.

Using this deposition material, deposition was continuously carried out five times in the same manner as in Example 5. Thereafter, the depositing hearth of the electron gun was replenished with the above deposition material, and the deposition was again continuously carried out five times. On each optical thin film thus formed, the refractive index was calculated from peak values of its spectral characteristics and the samarium concentration (in terms of oxide; % by weight) in the film was measured by fluorescent X-ray analysis.

As a result, in the present Example, too, the refractive index was kept stable and the samarium concentration in the film was also kept stable.

Comparative Example 3

Powder of lanthanum oxide ($La_2O_3$) and powder of aluminum oxide ($Al_2O_3$) were so mixed that the molar ratio of La and Al (La/Al) was 1, and the mixture obtained was pressure-molded. Thereafter, the molded product obtained was sintered at 1,500° C. for about 4 hours in a vacuum of $1\times10^{-4}$ Torr or below, followed by pulverization to produce a granular deposition material of 1 to 3 mm in diameter.

Next, this granular deposition material was loaded in a depositing hearth of the electron gun disposed in the vacuum deposition coater. The inside of the reactor was evacuated up to a pressure of $1\times10^{-5}$ Torr. Thereafter, oxygen gas was fed into the reactor at $1\times10^{-4}$ Torr and electron beams with an accelerating voltage of 8 kV and an emission current of 400 mA were applied to heat and melt the deposition material. Thereafter, on a depositing substrate made of glass, having been set in the reactor and heated to a temperature of about 300° C., an optical thin film with an optical film thickness of $\lambda/4$ ($\lambda$=480 nm) was deposited at a deposition rate of about 10 Å/second. This deposition was continuously carried out ten times on different substrates.

On each optical thin film thus formed, the refractive index was calculated from peak values of its spectral characteristics and the lanthanum concentration (in terms of oxide; % by weight) in the film was measured by fluorescent X-ray analysis to obtain the results shown in FIG. 4.

In the present Comparative Example, as shown in FIG. 4 (by dotted lines with white triangles and black triangles), the refractive index was unstable for each of the deposition times and the lanthanum concentration in each film showed a tendency of decrease, showing a result unsuited for the formation of optical thin films having stable refractive indexes.

Comparative Example 4

Powder of magnesium oxide (MgO) was pressure-molded. Thereafter, the molded product obtained was sintered at 1,500° C. for about 4 hours in the atmosphere, followed by pulverization to produce a granular deposition material of 1 to 3 mm in diameter. Then, using this deposition material, optical thin films were deposited in the same manner as in Example 5. Thereafter, the optical thin films formed were put to a weathering test in a thermo-hygrostat (60° C., 95% RH, 100 hours), and whether or not any clouding or yellowing occurred was visually examined.

As a result, the optical thin films in the present Comparative Example became cloudy, and were found to be unsuitable for optical purposes.

What is claimed is:

1. An optical-thin-film material comprising a compound represented by the following chemical formula:

$$Sm_{1-x}Al_{1+x}O_3$$

wherein $-1<x<1$.

2. The optical-thin-film material according to claim 1, wherein the compound comprises a sintered product of samarium oxide and aluminum oxide.

3. The optical-thin-film material according to claim 1, wherein the compound comprises a fused product of samarium oxide and aluminum oxide.

4. The optical-thin-film material according to claim 1, wherein the compound has a refractive index within the range of from 1.65 to 1.9.

5. An optical device comprising:

a substrate; and an optical thin film comprising the optical-thin-film material according to any one of claims 1 to 4, formed on the substrate.

6. An optical device comprising:

a substrate;

a plurality of first optical thin films comprising the optical-thin-film material according to any one of claims 1 to 4, formed on the substrate; and a plurality of second optical thin films each having a lower refractive index than the first optical thin films and superposed on the substrate alternately with the first optical thin films.

7. A process for producing the optical-thin-film material according to any one of claims 1 to 4, the process comprising the steps of:

mixing samarium oxide and aluminum oxide; and sintering or melting and solidifying the resultant mixture in a vacuum or in the atmosphere.

8. The process according to claim 7, wherein in the mixing step the samarium oxide and the aluminum oxide are so mixed that the molar ratio of samarium to aluminum is 0.3 or more.

9. An optical-thin-film material comprising a sintered product or a fused product of 10 to 80% by weight of samarium oxide and the balance of titanium oxide.

10. The optical-thin-film material according to claim 9, wherein the sintered product or the fused product has a refractive index within the range of from 1.9 to 2.4.

11. An optical device comprising:

a substrate; and an optical thin film comprising the optical-thin-film material according to claim 9 or claim 10, formed on the substrate.

12. An optical device comprising:

a substrate;

a plurality of first optical thin films comprising the optical-thin-film material according to claim 9 or claim 10, formed on the substrate; and a plurality of second optical thin films each having a lower refractive index than the first optical thin films and superposed on the substrate alternately with the first optical thin films.

* * * * *

UNITED STATES PATENT AND TRADEMARK OFFICE
CERTIFICATE OF CORRECTION

PATENT NO.    : 6,327,087 B1
DATED         : December 4, 2001
INVENTOR(S)   : Hashimoto et al.

It is certified that error appears in the above-identified patent and that said Letters Patent is hereby corrected as shown below:

<u>Drawings,</u>
Sheet 3, Figure 5A, "WAVE LENGTH" should read -- WAVELENGTH --; and
Sheet 3, Figure 5B, "WAVE LENGTH" should read -- WAVELENGTH --.

<u>Column 4,</u>
Line 12, "wavelengt" should read -- wavelength --;
Line 14, "10 th" should read -- 10th --;
Line 19, "FIG. 4" should read -- FIG. 7 --; and
Line 21, "fil" should read -- film --.

<u>Column 5,</u>
Line 53, "CO., LTD.)." should read -- Co., Ltd.). --.

<u>Column 7,</u>
Line 7, "$La_2Ti_2O_{7-x}$; = 0.3" should read -- $La_2Ti_2O_{7-x}$; x = 0.3 --.

<u>Column 9,</u>
Line 9, "CO., LTD.)." should read -- Co., Ltd.). --.
Line 16, "-thin" should read -- thin --.
Line 26, "10 th" should read -- 10th --.

Signed and Sealed this

Thirtieth Day of July, 2002

Attest:

JAMES E. ROGAN
*Attesting Officer*    *Director of the United States Patent and Trademark Office*